(12) United States Patent
Liu et al.

(10) Patent No.: US 12,575,064 B2
(45) Date of Patent: Mar. 10, 2026

(54) SYSTEMS AND METHODS FOR COOLING POWER ELECTRONICS USING A THERMOSYPHON

(71) Applicant: GM GLOBAL TECHNOLOGY OPERATIONS LLC, Detroit, MI (US)

(72) Inventors: Ming Liu, Shanghai (CN); Jian Yao, Shanghai (CN); Chengwu Duan, Shanghai (CN); Chih-hung Yen, Bloomfield Hills, MI (US); Anil K. Sachdev, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 413 days.

(21) Appl. No.: 18/127,115

(22) Filed: Mar. 28, 2023

(65) Prior Publication Data

US 2024/0130085 A1 Apr. 18, 2024

(30) Foreign Application Priority Data

Oct. 18, 2022 (CN) .......................... 202211272330.7

(51) Int. Cl.
H05K 7/20 (2006.01)

(52) U.S. Cl.
CPC ......... H05K 7/20336 (2013.01); H05K 7/203 (2013.01)

(58) Field of Classification Search
CPC .............. H05K 7/20336; H05K 7/203; H05K 7/20845; H05K 7/20881; H05K 7/2089; H05K 7/20936
See application file for complete search history.

(56) References Cited

U.S. PATENT DOCUMENTS

| | | | | |
|---|---|---|---|---|
| 4,871,884 A | * | 10/1989 | Hayashi ................. | H05K 7/026 |
| | | | | 361/752 |
| 7,965,510 B2 | * | 6/2011 | Suzuki ................... | B60K 6/405 |
| | | | | 361/689 |
| 9,414,520 B2 | * | 8/2016 | Campbell .......... | H05K 7/20936 |

(Continued)

FOREIGN PATENT DOCUMENTS

WO WO-2022249939 A1 * 12/2022 .............. H05K 7/06

OTHER PUBLICATIONS

WO 2022249939 A1 Translation (Year: 2022).*
German Office Action from counterpart DE1020231048325, dated Sep. 12, 2025.

*Primary Examiner* — Jayprakash N Gandhi
*Assistant Examiner* — Matthew Sinclair Muir

(57) ABSTRACT

A cooling system includes a housing including a base portion with sides and a bottom surface that define a cavity and a cover portion to enclose the base portion and including cooling members attached thereto. A shield is arranged in the cavity. A vertical member is arranged below the shield to define a first fluid chamber between one side of the vertical member and one side of the base portion and a second fluid chamber between an opposite side of the vertical member and another side of the base portion. The electronic components are arranged in the second fluid chamber. Cooling fluid is arranged in the cavity and has a fluid level below at least a portion of the shield. The housing is mounted at an inclined angle relative to horizontal or the housing is mounted parallel to horizontal and the shield is mounted at the inclined angle.

20 Claims, 4 Drawing Sheets

(56) References Cited

U.S. PATENT DOCUMENTS

| | | | |
|---|---|---|---|
| 11,252,840 B2 | 2/2022 | Sachdev et al. | |
| 2010/0328890 A1 | 12/2010 | Campbell et al. | |
| 2017/0290198 A1* | 10/2017 | Shepard | H05K 7/20881 |
| 2018/0042138 A1* | 2/2018 | Campbell | H05K 7/203 |
| 2023/0142008 A1* | 5/2023 | Sim | H02P 27/04 |
| | | | 324/765.01 |
| 2023/0292473 A1* | 9/2023 | Sunaga | H05K 7/20927 |

* cited by examiner

SYSTEMS AND METHODS FOR COOLING POWER ELECTRONICS USING A THERMOSYPHON

CROSS-REFERENCE TO RELATED APPLICATIONS

This application claims the benefit of Chinese Patent Application No. 202211272330.7, filed on Oct. 18, 2022. The entire disclosure of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to systems and methods for cooling power electronics, and more particularly to systems and methods for cooling power electronics using a thermosyphon.

Electric vehicles (EVs) such as battery electric vehicles (BEVs), hybrid vehicles, and/or fuel cell vehicles include one or more electric machines and a battery system including one or more battery cells, modules and/or packs to provide propulsion power. EVs include a power control system including a power inverter module that controls power to/from the battery system during charging, propulsion and/or regeneration. During use, electrical components of the power control system such as a power inverter, control board, gate control board, busbars and other components may need to be cooled.

SUMMARY

A cooling system for electronics includes a housing including a base portion with sides and a bottom surface that define a cavity and a cover portion to enclose the base portion and including cooling members attached thereto. A shield is arranged in the cavity between the electronic components and the cover portion. A vertical member is arranged below the shield to define a first fluid chamber between one side of the vertical member and one side of the base portion and a second fluid chamber between an opposite side of the vertical member and another side of the base portion. The electronic components are arranged in the second fluid chamber. Cooling fluid is arranged in the cavity and having a fluid level below at least a portion of the shield. The housing is mounted at an inclined angle relative to horizontal or the housing is mounted parallel to horizontal and the shield is mounted at the inclined angle relative to horizontal.

In other features, an upper edge of the vertical member is connected to an edge of the shield. An upper edge of the vertical member and an edge of the shield are arranged below the fluid level. A lower edge of the vertical member includes a plurality of openings to allow fluid to flow from the first fluid chamber to the second fluid chamber. The vertical member includes a gate printed circuit board (PCB).

In other features, the electronic components comprise at least one of a power inverter, busbars, a current sensor, and a bulk capacitor.

In other features, the electronic components comprise include a power inverter module including a plurality of power switches. A current sensor is connected to the power inverter module by first busbars. AC busbars connected to the current sensor. A bulk capacitor is connected by second busbars to the power inverter module. DC busbars are connected to the bulk capacitor.

In other features, a hydrophobic coating is arranged on an upwardly facing surface of the shield. The cover portion is made of metal, and wherein the cooling members extend from top and bottom surfaces of the cover portion. The cooling members comprise tubes.

A cooling system for electronics includes a housing including a base portion including sides and a bottom surface that define a cavity and a cover portion to enclose the base portion and including cooling members attached thereto. A power inverter module includes a plurality of power switches. A shield is arranged in the cavity below a control printed circuit board (PCB). A gate printed circuit board (PCB) is arranged vertically in the housing and defining a first fluid chamber between one side of the gate PCB and one side of the base portion and a second fluid chamber between an opposite side of the gate PCB and another side of the base portion. The power inverter module is arranged in the second fluid chamber. Cooling fluid is arranged in the cavity and has a fluid level below at least a portion of the shield. The housing is mounted at an inclined angle relative to horizontal or the housing is mounted parallel to horizontal and the shield is mounted at the inclined angle relative to horizontal.

In other features, the gate PCB is connected to an edge of the shield. A lower edge of the shield is arranged below the fluid level. A lower edge of the gate PCB includes a plurality of openings to allow fluid to flow from the first fluid chamber to the second fluid chamber. The power inverter module includes a plurality of power switches. A current sensor is connected to the power inverter module by first busbars. AC busbars are connected to the current sensor. A bulk capacitor is connected by second busbars to the power inverter module. DC busbars connected to the bulk capacitor.

In other features, the current sensor, the AC busbars, the bulk capacitor, and the DC busbars are arranged in the second fluid chamber. A hydrophobic coating is arranged on an upwardly facing surface of the shield. The cover portion is made of metal, and wherein the cooling members extend from top and bottom surfaces of the cover portion. The base portion is made of metal. The cooling members comprise tubes.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

While the systems and methods for cooling power electronics according to the present disclosure are described further below in the context of power electronics of a power inverter assembly for an EV, the systems and methods for cooling power electronics can be used with other types of electronics and/or in non-vehicle applications.

The systems and methods for cooling power electronics according to the present disclosure provide enhanced two-phase immersive cooling for power electronics. The cooling system forms a thermosyphon within a sealed housing. The cooling system generates a self-sustaining and self-enhancing flow velocity of cooling fluid without using a pump. The systems and methods for cooling power electronics enhance the cooling capability of the system, reduce weight, and increase the range of the EV.

In some examples, a shield is used in the sealed housing to reduce electromagnetic interference. A surface of a shield is at least partially located above the cooling fluid level within the sealed housing. The shield is coated with a hydrophobic coating to enhance collection and flow of condensed cooling fluid.

During operation, the heat generated by the power electronics vaporizes the cooling fluid. The coolant vapor rises and is condensed by cooling members attached to a cover portion of the housing. The condensed fluid drips onto the shield and flows into a first fluid chamber formed between one side of a vertical member (such as a gate PCB) and a side of a base portion of the housing. This sets up a nonequilibrium in hydrostatic pressure between cooling fluid in the first fluid chamber and cooling fluid in a second chamber (located between an opposite side of the vertical member and another side of the base portion). The denser liquid flows downwards in the first fluid chamber and passes to the second fluid chamber. The cooling fluid in the second fluid chamber is vaporized and the process repeats. This action corresponds to a thermosyphon loop that is controlled by density differences and heat dissipation from the power electronics.

Figure 1:
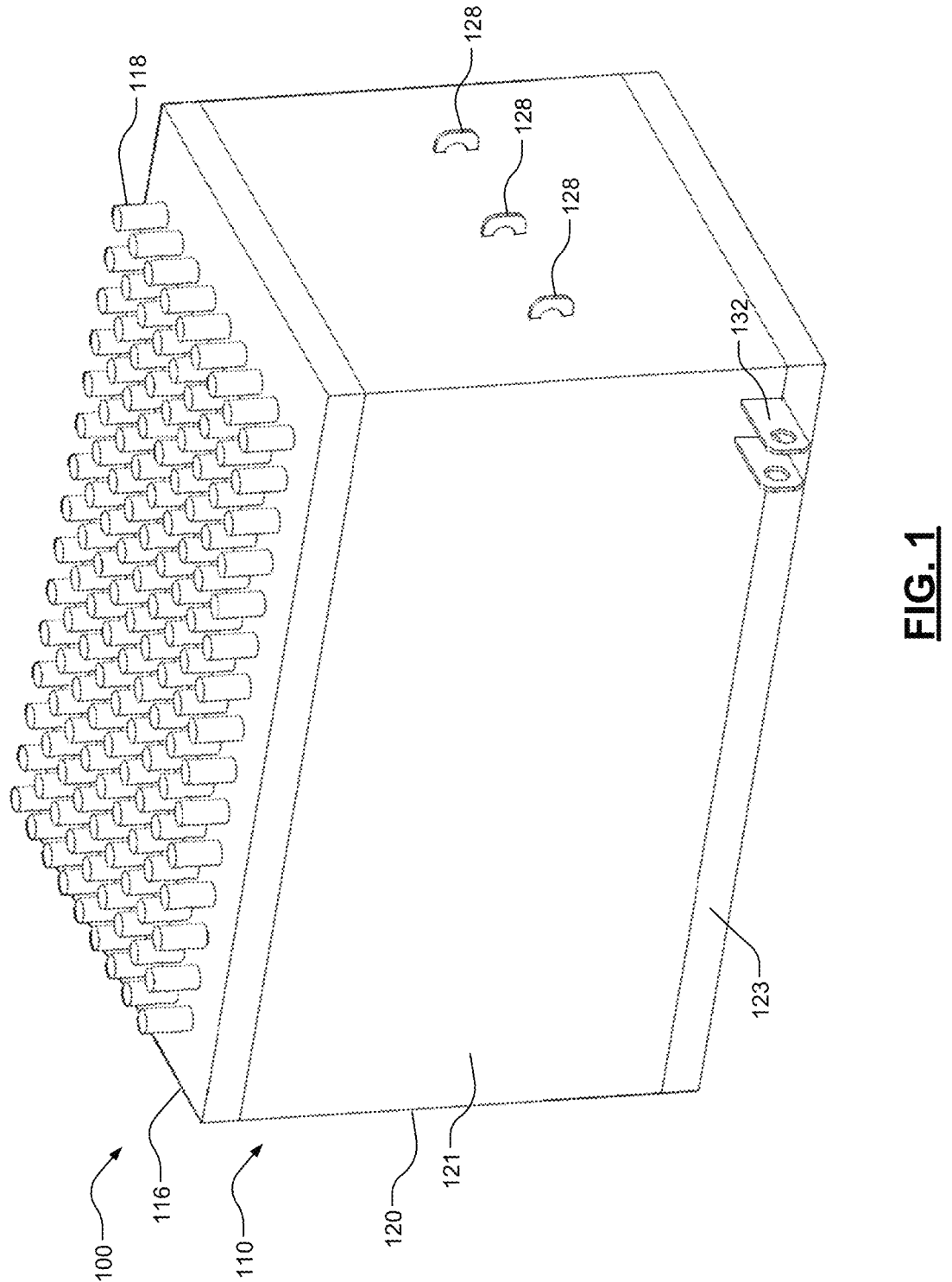
FIG. 1 is a perspective view of an example of a power inverter assembly according to the present disclosure.

Referring now to FIG. 1, a power inverter assembly 100 is shown. The power inverter assembly 100 includes a housing 110 with a base portion 120 and a cover portion 116. In some examples, the base portion 120 and the cover portion 116 have a rectangular cross-section, although other shapes can be used. In some examples, the cover portion 116 and the base portion 120 are made of metal such as aluminum or steel, although other materials can be used. The base portion 120 includes sides 121 and a bottom surface 123 defining an inner cavity. In some examples, the cover portion 116 provides a seal with the cavity of the base portion 120.

The cover portion 116 includes cooling members 118 extending upwardly (shown) and downwardly (cooling members 119 in FIG. 2) therefrom to provide heat exchange between vaporized cooling fluid in the cavity and ambient. In some examples, the cooling members 118 and 119 include an array of tubes that are made of metal such as aluminum or steel, have a predetermined length and a circular cross-section, although other types of cooling members can be used.

AC busbars 128 extend from one of the sides 121 of the housing 110. DC busbars 132 extend from another one of the sides 121 of the housing 110. The AC busbars 128 are connected to an electric motor (FIG. 4) and the DC busbars 132 are connected to the battery system.

Figure 2:
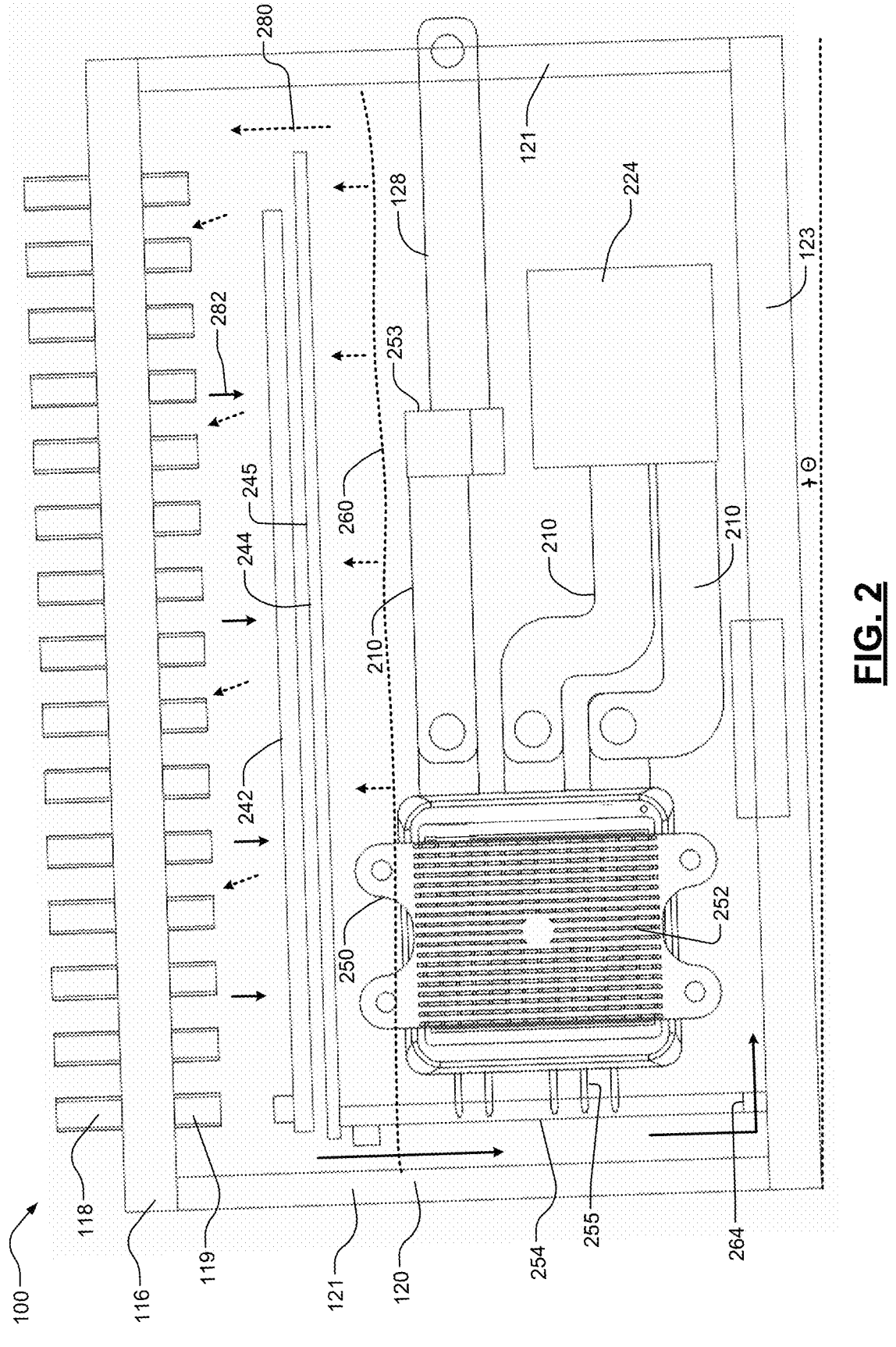
FIG. 2 is a side cross-sectional view of an example of a power inverter assembly according to the present disclosure.

Referring now to FIG. 2, the power inverter assembly 100 is shown in further detail. Electrical components of the power inverter assembly 100 are arranged in the base portion 120. The electrical components of the power inverter assembly 100 include busbars 210 that provide connections to and from a power inverter module 250. The AC busbars 128 are connected to a current sensor 253. The busbars 210 connect the current sensor 253 to the power inverter module 250. The power inverter module 250 includes an array of power switches that are opened and closed during operation to control power supplied by the battery system to the electric motor (during propulsion) and/or to return power to the battery system from the electric motor (during regeneration) or from a utility (during charging). The power inverter module 250 may also include cooling fins 252 to exchange heat with a cooling fluid 260 that partially fills the base portion 120.

The busbars 210 also connect the power inverter module 250 to a bulk capacitor 224, which is connected to the DC busbars 132 (and is partially or fully immersed in the cooling fluid 260). Gate pins 255 connect the power inverter module 250 to a gate printed circuit board (PCB) 254 (that is partially or fully immersed in the cooling fluid 260). The gate PCB 254 supplies gate control signals to control the power switches in the power inverter module 250.

A shield 244 is arranged between a control PCB 242 and the power inverter module 250 and other components. The control PCB 242 communicates with a vehicle controller, the current sensor 253 and/or other components and sends control signals to the gate PCB 254. In some examples, the control PCB 242 has a width and a length that are less than corresponding dimensions of the shield 244 to define a channel around two or more edges of the control PCB 242. The channel allows condensed fluid to return to the first fluid chamber via the shield 244. In some examples, the shield 244 reduces electromagnetic interference (EMI) to ensure electromagnetic compatibility (EMC) of the control PCB 242, the gate PCB 254, and other components in the base portion.

In some examples, the shield 244 includes a hydrophobic coating 245 on an upper surface thereof. The hydrophobic coating 245 increases flow of condensed cooling fluid to the first fluid chamber defined between the side 121 of the housing 110 and the gate PCB 254. The hydrophobic coating 245 reduces the wettability of the fluid on the surface (in some examples, the contact angle is greater than 150°) and thus accelerates movement of the condensed droplets.

In this example, the housing 110 is mounted in an inclined position relative to a horizontal plane to cause the condensed fluid to drain into the first fluid chamber. Since the housing 110 is inclined, the shield 244 can be arranged parallel to the bottom surface 123 of the housing 110. In some examples, the base portion 120 and/or the shield 244 are inclined at a predetermined angle (relative to horizontal) in a range between 2° and 20°, although other angles can be used. In some examples, the base portion 120 is inclined at a predetermined angle (relative to horizontal) in a range between 3° and 10°, although other angles can be used.

The cooling fluid 260 fills the chamber to a predetermined fluid level. In some examples, the predetermined fluid level is located below some or all of the shield 244 and above some or all of the power inverter module 250. When components of the power inverter assembly 100 are heated during operation, the cooling fluid 260 absorbs the heat. Some of the cooling fluid 260 is vaporized by the heat as shown at 280.

The vaporized fluid 280 rises and is cooled by the cooling members 118 and 119 of the cover portion 116. The vaporized fluid 280 condenses and condensed cooling fluid 282 falls from the cooling members 119 onto the shield 244. The condensed cooling fluid 282 flows along the control PCB 242 and/or the shield 244 in a downward direction (left in FIG. 2) due to the inclined mounting position of the housing 110. The condensed cooling fluid 282 flows downwardly into the first fluid chamber and through one or more openings 264 located on a bottom edge of the gate PCB 254. The cooling fluid 260 is vaporized and the thermosyphon process continues to cause circular flow from liquid cooling fluid to vapor cooling fluid to liquid cooling fluid, etc.

In some examples, a lower edge of the shield 244 is connected to the gate PCB 254 to separate the cooling fluid into the first and second (or main) fluid chambers. The first fluid chamber is located on one side of the gate PCB 254. Bubbles that are formed levitate from the second fluid chamber (where the hot power electronics are located) to form a syphon. In other examples, the lower end of the shield 244 can be immersed in the cooling fluid to achieve the same syphon structure without requiring a connection between edges of the gate PCB and the shield 244. In some examples, the gate PCB 254 is arranged vertically and placed on one side of the housing to form the first fluid chamber along with the side 121 of the housing 110. Openings 264 in the bottom edge of the gate PCB 254 provide a flow channel to the heat source in the second or main fluid chamber.

Figures 3, 4:
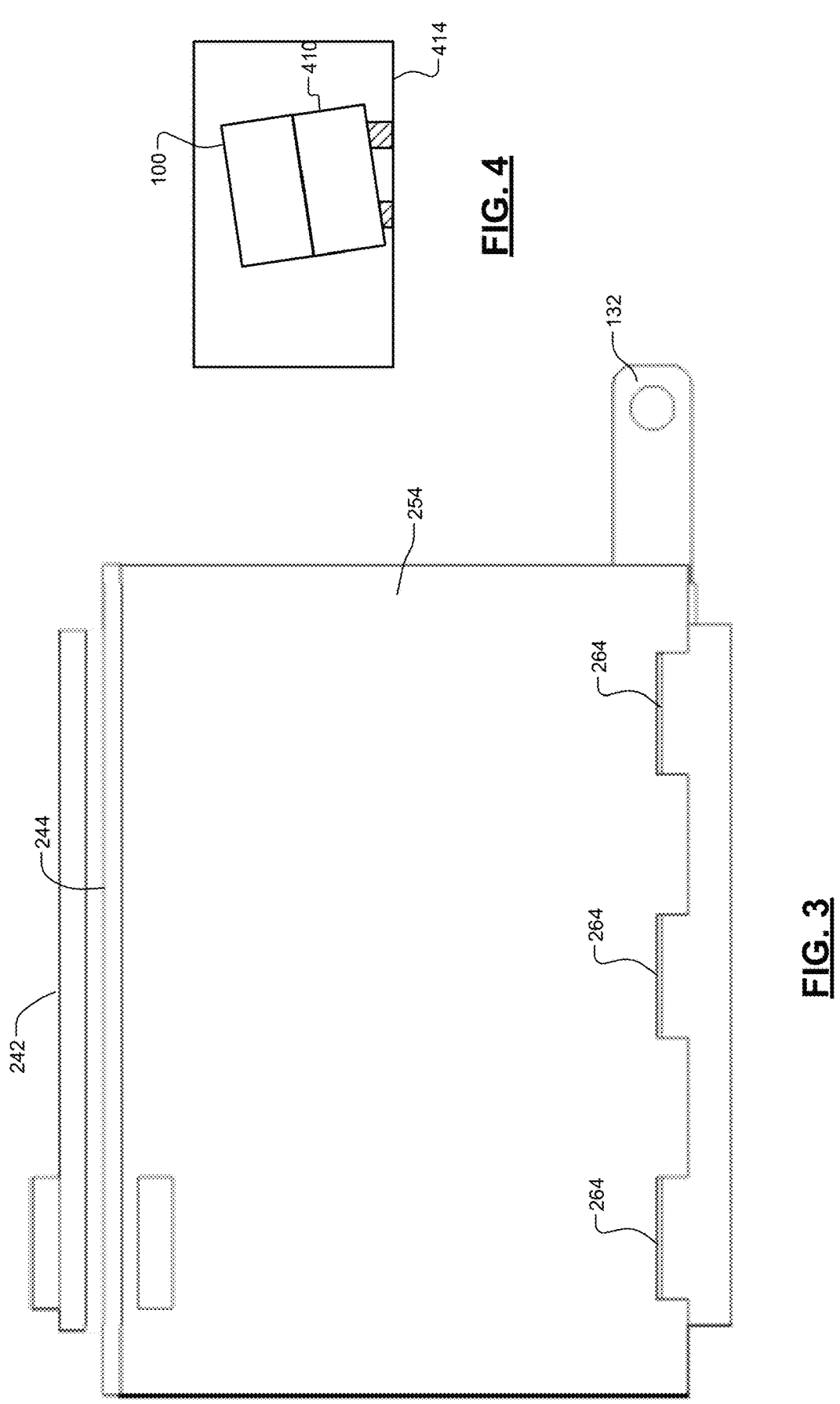
FIG. 3 is an end view of an example of the power inverter assembly according to the present disclosure.
FIG. 4 is a functional block diagram of an electric motor assembly including a power inverter assembly according to the present disclosure.

Referring now to FIG. 3, an end view of components of the power inverter assembly 100 (without the housing 110) are shown. The gate PCB 254 includes three of the openings 264 located along a lower edge 310 of the gate PCB 254, although fewer or additional openings 264 can be used.

Referring now to FIG. 4, the power inverter assembly 100 can be connected to or integrated with an electric motor assembly 410. The power inverter assembly 100 and/or the power inverter assembly 100 and the electric motor assembly 410 can be mounted in the inclined position.

Figure 5:
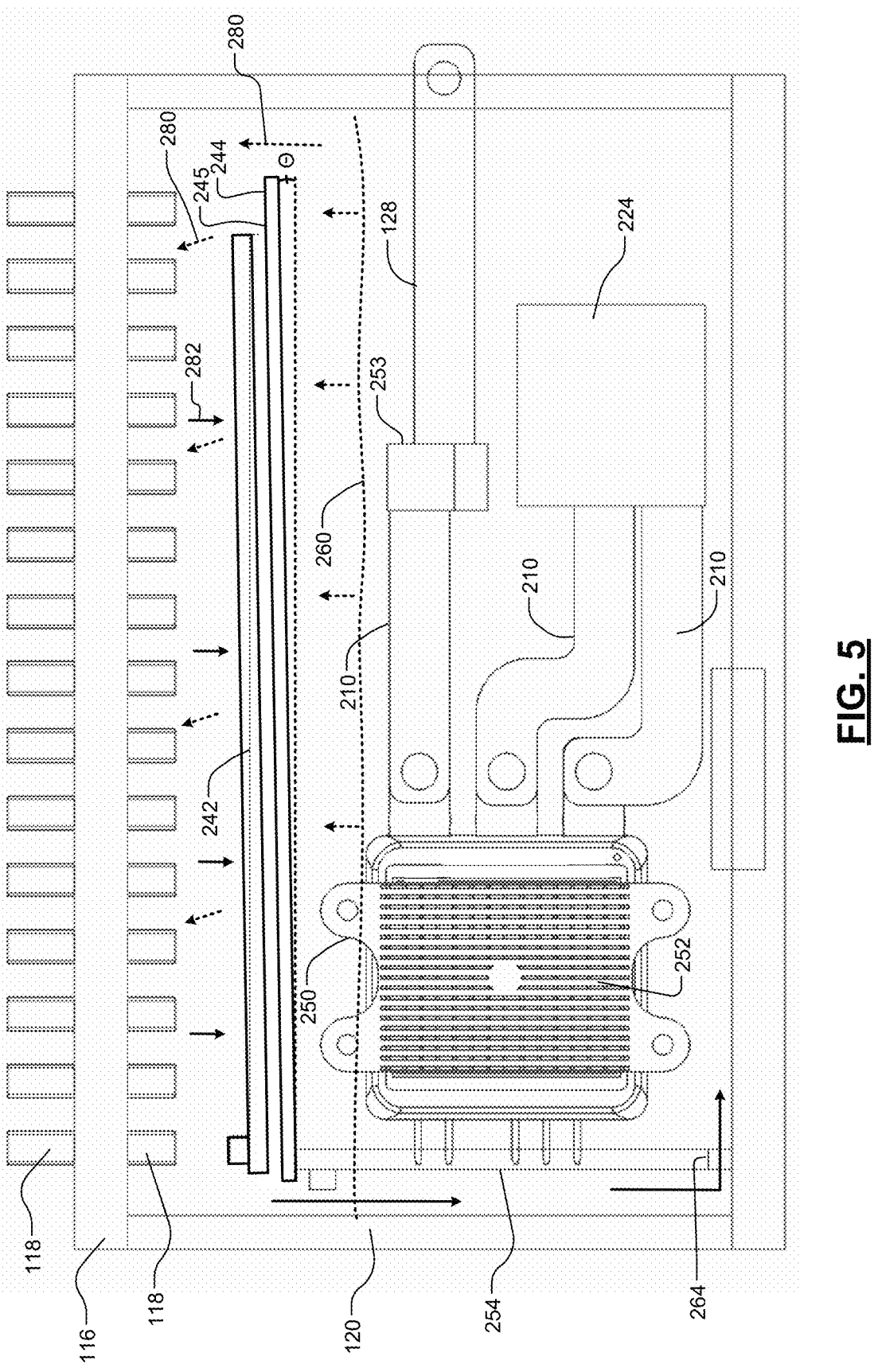
FIG. 5 is a side cross-sectional view of another example of a power inverter assembly according to the present disclosure.

Referring now to FIG. 5, the bottom surface 123 of the housing 110 of the power inverter assembly 100 can be mounted parallel to a horizontal position. In this example, the control PCB 242 and/or the shield 244 can be mounted at the inclined position relative to the bottom surface 123 of the housing 110.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A cooling system for electronics, comprising:
a housing including:
a base portion including sides and a bottom surface that define a cavity; and
a cover portion to enclose the base portion and including cooling members attached thereto;
a power inverter module including a plurality of power switches;
a control printed circuit board (PCB);
a shield arranged in the cavity below the control PCB;
a gate printed circuit board (PCB) arranged vertically in the housing and defining a first fluid chamber between one side of the gate PCB and one side of the base portion and a second fluid chamber between an opposite side of the gate PCB and another side of the base portion,
wherein the power inverter module is arranged in the second fluid chamber; and
cooling fluid arranged in the cavity and having a fluid level below at least a portion of the shield,
wherein one of:
the housing is mounted at an inclined angle relative to horizontal; and
the housing is mounted parallel to horizontal, and the shield is mounted at the inclined angle relative to horizontal;
wherein a width and a length of the control PCB are less than corresponding dimensions of the shield to define a channel around two or more edges of the control PCB, wherein the channel directs condensed fluid to return to the first fluid chamber.

2. The cooling system of claim 1, wherein the gate PCB is connected to an edge of the shield.

3. The cooling system of claim 1, a lower edge of the shield is arranged below the fluid level.

4. The cooling system of claim 1, wherein a lower edge of the gate PCB includes a plurality of openings to allow fluid to flow from the first fluid chamber to the second fluid chamber.

5. The cooling system of claim 1, wherein the power inverter module includes a plurality of power switches and further comprising:
   a current sensor connected to the power inverter module by first busbars;
   AC busbars connected to the current sensor;
   a bulk capacitor connected by second busbars to the power inverter module; and
   DC busbars connected to the bulk capacitor.

6. The cooling system of claim 5, wherein the current sensor, the AC busbars, the bulk capacitor, and the DC busbars are arranged in the second fluid chamber.

7. The cooling system of claim 1, further comprising a hydrophobic coating on an upwardly facing surface of the shield.

8. The cooling system of claim 1, wherein the cover portion is made of metal, and wherein the cooling members extend from top and bottom surfaces of the cover portion.

9. The cooling system of claim 1, wherein the base portion is made of metal.

10. The cooling system of claim 1, wherein the cooling members comprise tubes.

11. A cooling system for electronics, comprising:
   a housing including:
      a base portion with sides and a bottom surface that define a cavity; and
      a cover portion to enclose the base portion and including cooling members attached thereto;
   electronic components;
   a shield arranged parallel to the bottom surface in the cavity between the electronic components and the cover portion;
   a vertical member arranged below the shield to define a first fluid chamber between one side of the vertical member and one side of the base portion and a second fluid chamber between an opposite side of the vertical member and another side of the base portion,
   wherein the electronic components are arranged in the second fluid chamber; and
   cooling fluid arranged in the cavity and having a fluid level below at least a portion of the shield, and
   wherein one of:
      the housing is mounted at an inclined angle relative to horizontal; and
      the housing is mounted parallel to horizontal, and the shield is mounted at the inclined angle relative to horizontal.

12. The cooling system of claim 11, wherein an upper edge of the vertical member is connected to an edge of the shield.

13. The cooling system of claim 11, wherein an upper edge of the vertical member and an edge of the shield are arranged below the fluid level.

14. The cooling system of claim 11, wherein a lower edge of the vertical member includes a plurality of openings to allow fluid to flow from the first fluid chamber to the second fluid chamber.

15. The cooling system of claim 11, wherein the vertical member includes a gate printed circuit board (PCB).

16. The cooling system of claim 15, wherein the electronic components comprise at least one of a power inverter, busbars, a current sensor, and a bulk capacitor.

17. The cooling system of claim 15, wherein the electronic components comprise:
   a power inverter module including a plurality of power switches;
   a current sensor connected to the power inverter module by first busbars;
   AC busbars connected to the current sensor;
   a bulk capacitor connected by second busbars to the power inverter module; and
   DC busbars connected to the bulk capacitor.

18. The cooling system of claim 11, wherein the cover portion is made of metal, and wherein the cooling members extend from top and bottom surfaces of the cover portion.

19. The cooling system of claim 11, wherein the cooling members comprise tubes.

20. A cooling system for electronics, comprising:
   a housing including:
      a base portion with sides and a bottom surface that define a cavity; and
      a cover portion to enclose the base portion and including cooling members attached thereto;
   electronic components;
   a shield arranged in the cavity between the electronic components and the cover portion;
   a vertical member arranged below the shield to define a first fluid chamber between one side of the vertical member and one side of the base portion and a second fluid chamber between an opposite side of the vertical member and another side of the base portion,
   wherein the electronic components are arranged in the second fluid chamber; and
   cooling fluid arranged in the cavity and having a fluid level below at least a portion of the shield, and
   wherein one of:
      the housing is mounted at an inclined angle relative to horizontal; and
      the housing is mounted parallel to horizontal, and the shield is mounted at the inclined angle relative to horizontal; and
   a hydrophobic coating on an upwardly facing surface of the shield.

* * * * *